(12) United States Patent
Elenius et al.

(10) Patent No.: US 6,578,755 B1
(45) Date of Patent: Jun. 17, 2003

(54) POLYMER COLLAR FOR SOLDER BUMPS

(75) Inventors: Peter Elenius, Scottsdale, AZ (US); Deok-Hoon Kim, Phoenix, AZ (US)

(73) Assignee: Flip Chip Technologies, L.L.C., Phoenix, AZ (US)

( * ) Notice: Subject to any disclaimer, the term of this patent is extended or adjusted under 35 U.S.C. 154(b) by 0 days.

(21) Appl. No.: 09/668,450

(22) Filed: Sep. 22, 2000

(51) Int. Cl.[7] .............................................. B23K 31/02
(52) U.S. Cl. .................................... 228/254; 228/123.1
(58) Field of Search ........................... 228/254, 180.22, 228/173.2, 123.1, 253, 214; 29/840, 841; 257/789, 787, 788, 737, 738

(56) References Cited

U.S. PATENT DOCUMENTS

| | | |
|---|---|---|
| 5,220,200 A | 6/1993 | Blanton |
| 5,261,593 A | 11/1993 | Casson et al. |
| 5,547,740 A | 8/1996 | Higdon et al. |
| 5,564,617 A | 10/1996 | Degani et al. |
| 5,747,102 A * | 5/1998 | Smith et al. |
| 5,847,456 A | 12/1998 | Shoji |
| 5,869,904 A | 2/1999 | Shoji |
| 5,975,408 A * | 11/1999 | Goossen |
| 5,988,485 A * | 11/1999 | Master et al. |
| 6,121,689 A * | 9/2000 | Capote et al. |
| 6,190,940 B1 * | 2/2001 | DeFelice et al. |
| 6,194,788 B1 * | 2/2001 | Gilleo et al. |
| 6,209,196 B1 * | 4/2001 | Ozono et al. |
| 6,228,678 B1 * | 5/2001 | Gilleo et al. |
| 6,234,379 B1 * | 5/2001 | Donges |
| 6,265,776 B1 * | 7/2001 | Gilleo |
| 6,297,560 B1 * | 10/2001 | Capote et al. |
| 6,352,881 B1 * | 3/2002 | Nguyen et al. |
| 6,373,142 B1 * | 4/2002 | Hoang |

FOREIGN PATENT DOCUMENTS

JP 08041165 9/1997

OTHER PUBLICATIONS

Shoji, Kazutaka, et al., "New Technology for enhancing Solder Reliability of $D^2BGA$ (Die Dimension BGA)", VLSI Package Development Dept., VLSI Packaging and Testing Engineering Division, NEC Corporation, 1997.

Topper, et al., "Wafer Level Package using Double Balls," *Proceedings IMAPS Materials Conference*, Mar. 2000, pp. 198–200.

Topper, et al., Fab Integrated Packaging (FIP): A New Concept for High Reliability Wafer–Level Chip Size Packaging, *IEEE Proceedings of Electronic Components & Technology Conference*, May 2000, pp. 74–80.

* cited by examiner

*Primary Examiner*—Tom Dunn
*Assistant Examiner*—Jonathan Johnson
(74) *Attorney, Agent, or Firm*—Cahill, von Hellens & Glazer P.L.C.

(57) ABSTRACT

A method of forming a polymer support ring, or collar, around the base of solder balls used to form solder joints includes forming patterned regions of uncured polymer material over each of the conductive solder bump pads on an IC package or other substrate to which the solder balls are to be attached. Preferably, the uncured polymer material is a no-flow underfill material that fluxes the solder bump pads. Pre-formed solder balls are then placed into the uncured polymer material onto their respective solder bump pads. A subsequent heating cycle raises the assembly to the reflow temperature of the solder balls, thereby attaching the solder balls to the underlying solder bump pads, and at least partially curing the polymer material to form a support collar at the base region of each attached solder ball.

37 Claims, 4 Drawing Sheets

POLYMER COLLAR FOR SOLDER BUMPS

BACKGROUND OF THE INVENTION

1. Field of the Invention

The present invention relates generally to the formation of solder joints to electrodes on a substrate, such as solder bumps used in conjunction with solder bump array integrated circuit packages (i.e., flip chip assemblies, chip scale packages, and ball grid array structures), and more particularly, to a method of reinforcing such solder bumps in a manner that reduces failures due to temperature cycling.

2. Description of the Related Art

Surface mount technology using solder bump array integrated circuit packages (hereinafter referred to as an IC package) is well known in the semiconductor industry for simplifying the packaging and interconnection of integrated circuits. Typically, a series of circular (as viewed from above, or semi-spherical in three dimensions) solder bumps are formed upon the surface of an IC package or other substrate in electrical contact with active or passive devices formed or attached upon such substrate. Such solder bumps are then aligned with pads formed in a corresponding pattern upon a second substrate to which the first substrate is to be mounted. The aforementioned integrated circuit packages are typically produced with die that are scribed from a semiconductor wafer. During processing, such semiconductor wafer has an upper active surface through which impurities are introduced, by chemical diffusion and/or implantation, to form individual transistors and other electronic components. Metallization layers are also patterned upon the upper, or active, surface of such semiconductor wafer to electrically interconnect the electrodes of the various devices formed in such semiconductor wafer. For flip chips, the upper active surface of scribed integrated circuit die are inverted, or flipped, in order to be solder connected to an underlying patterned substrate. Heating of the solder bumps to their "reflow" temperature melts the solder, and the "reflow" of the solder joins the flip chip electrically and mechanically with the underlying patterned support substrate. The use of solder bumps to interconnect such flip chip integrated circuits to underlying support substrates is disclosed, for example, within U.S. Pat. No. 5,261,593 to Casson, et al.; within U.S. Pat. No. 5,220,200 to Blanton; within U.S. Pat. No. 5,547,740 to Higdon, et al.; and within U.S. Pat. No. 5,564,617 to Degani, et al.

Often, the IC package and the supporting substrate (i.e., printed circuit board, ceramic substrate, etc.) to which it is joined have different CTEs (Coefficients of Thermal Expansion). During thermal cycling, the CTE mismatch will create thermal strains/stresses which will fracture the solder bumps used to join the IC package to the supporting substrate, causing the circuitry to fail. Two methods have been used to improve the reliability of solder joints that use solder balls. A first common technique for IC package joints is to utilize an underfill encapsulant that flows between the IC package and the supporting substrate, filling the space around the solder bumps, as well as physically connecting the IC package surface to the substrate surface, to constrain thermal expansion differences between the IC package and the substrate, thereby improving the solder joint fatigue life. While the use of such underfill material improves the fatigue life of the solder joints, the application of this underfill is often perceived as an expensive process that is not consistent with standard surface mount technology manufacturing processes.

The second technique that has been mentioned in the technical literature has been to partially encapsulate the base of the solder balls to minimize the stresses to which the base of the solder ball is subjected. The base of the solder ball is typically where a solder fatigue crack will initiate and propagate. One method of stabilizing the base of the solder ball has been described by ceramics supplier Kyocera in conjunction with a DBGA (Dimpled Ball Grid Array) process wherein an extra layer of ceramic is placed upon a multi-layer ceramic substrate prior to solder ball attachment; the extra layer of ceramic has holes formed therein over the solderable pads. A second method of stabilizing the base of the solder balls has been described by NEC Corporation using a resin reinforcement layer that is dispensed around the solder balls following solder ball attachment to the solderable pads. This NEC technique is described in a technical paper entitled "New Technology for enhancing Solder Reliability of $D^2BGA$ (Die Dimension BGA", by Kazutaka Shoji, et al., presented in 1997. Related subject matter is disclosed within U.S. Pat. No. 5,847,456, issued on Dec. 8, 1998, to Shoji, and within U.S. Pat. No. 5,869,904, issued on Feb. 9, 1999, to Shoji; both of these patents are assigned to NEC Corporation of Tokyo, Japan.

However, the methods that have been used in the past to stabilize solder ball joints, and thereby improve the reliability of such solder ball joints, are generally complex and significantly increase manufacturing expense. Typical techniques of applying and patterning a solder mask prior to ball placement, while feasible, add cost and potentially impact package reliability and susceptibility to moisture damage. Moreover, the application of underfill layers or reinforcement resins following the ball attachment process do not serve to help maintain the shape of the solder balls during the initial ball attachment process. In addition, the above-described techniques for applying underfill layers or resin reinforcements following the ball attachment process also add significantly to manufacturing expense and process complexity.

Accordingly, it is an object of the present invention to provide an improved method for forming solder bumps for flip chip integrated circuits, chip scale packages, and ball grid array structures, which is consistent with standard surface mount technology manufacturing processes, and which provides additional mechanical support to the base of solder balls to protects the solder balls from fatigue induced by thermal coefficient differentials, thereby increasing the reliability of such solder balls, without significantly increasing manufacturing costs or processing complexity.

It is another object of the present invention to provide such a method which can be carried out at the wafer processing level, or in the case of ball grid arrays or chip scale packages, in matrix/multi-up configurations, or on individual packages.

Still another object of the present invention is to provide such a method which combines the step of reinforcing the base of a solder ball with the step of applying a flux to solder ball pads prior to ball attachment.

Yet another object of the present invention is to provide such a method which can be applied to a variety of electronic packaging applications, including without limitation, Ball Grid Array (BGA), Chip Scale Package (CSP) and flip chip structures.

A further object of the present invention is to provide such a method which helps to maintain the original shape of solder balls during ball attachment and during subsequent reflow operations.

These and other objects of the present invention will become more apparent to those skilled in the art as the description of the present invention proceeds.

SUMMARY OF THE INVENTION

Briefly described, and in accordance with a preferred embodiment thereof, the present invention relates to a method of forming a solder-bumped structure upon a substrate, such as an IC package, by initially providing a first conductive solder bump pad on the surface of the substrate. An uncured polymer material is then applied over the solder bump pad. This uncured polymer material is preferably a no-flow underfill material of a type which achieves a fluxing action by reducing metal oxides that may have formed upon the solder bump pad or upon the base region of a solder ball that is to be joined with such solder bump pad. The base region of a first pre-formed solder ball is then advanced into the uncured polymer material and onto the first solder bump pad. The resulting assembly is then heated to the characteristic reflow temperature of the first solder ball to join the base region of the first solder ball to the first conductive solder bump pad in the form of a metallurgical joint. This heating cycle also serves to at least partially cure the polymer material surrounding the base region of the first solder ball. The polymer material thereby forms a support ring, or collar, around the base of the solder ball to stabilize such base region, and to guard against solder fatigue failure.

In the preferred embodiment of the present invention, the substrate includes two or more of such conductive solder bump pads formed upon the surface of the substrate, and the uncured polymer material is applied over each of such solder bump pads. Pre-formed solder balls are placed over each of such solder bump pads, the base region of each such solder ball advancing into the uncured polymer material and onto its respective solder bump pad. The base region of each such solder ball is then joined to its respective solder bump pad during the reflow heating cycle, during which the polymer material surrounding the base region of each solder ball is at least partially cured.

While the uncured polymer material can be applied as a continuous layer across the substrate, it is preferred that the uncured polymer material be applied as patterned regions each overlying one of the solder bump pads. To achieve such a patterned application of the uncured polymer material, the uncured polymer material can be printed onto the substrate through a patterned screen or stencil. The uncured polymer material preferably has a viscosity of at least 30,000 centipoise for optimal printing, and to avoid significant spreading away from the solder bump pad following application.

As alternatives to application of the polymer material by printing methods, the polymer material can also be applied to the solder bump pads by dispense techniques, including jetting technologies, or by the pin transfer method. A further embodiment of the present invention involves grasping each solder ball prior to placement, applying the polymer material to the base region of the grasped solder ball, and then placing the grasped solder ball onto its associated solder bump pad, thereby simultaneously applying the polymer material to the solder bump pad and placing the pre-formed solder ball onto the solder bump pad.

Should the heating cycle used to join the solder balls to their respective solder bump pads at the reflow temperature prove to be insufficient to complete the curing of the polymer material, a further heating cycle is added to finish curing the polymer material.

The method of the present invention improves solder joint life by enhancing the mechanical support of the base of the solder joint, thereby reducing fatigue failures induced by thermal stresses. The aforementioned method of producing such a polymer collar can be achieved at a much lower manufacturing cost as compared with known techniques for encapsulating solder joints. The polymer material that forms the collar doubles as a fluxing agent, and further serves to help maintain the shape of the solder ball during ball attachment operations.

DETAILED DESCRIPTION OF THE PREFERRED EMBODIMENT

Figure 1:
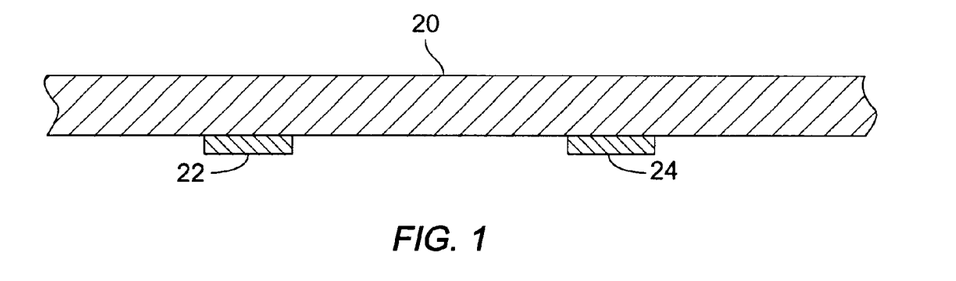
FIG. 1 is a cross-sectional drawing of a first substrate, such as an IC package, having conductive solder bump pads formed upon a surface thereof.

FIGS. 1–6 are cross-sectional drawings which illustrate the sequence of processing steps that are followed in practicing the preferred method of forming polymer collars for supporting solder bumps in accordance with the present invention. In FIG. 1, a substrate 20 represents, for example, an IC package having a series of active and passive devices formed therein or attached thereto, and having one or more layers of metallization formed therein for electrically interconnecting such devices together. Substrate 20 may be a semiconductor wafer having several hundred integrated circuits formed thereon, as the method of the present invention can advantageously be practiced at the wafer level, before individual integrated circuit die are scribed from the semiconductor wafer. Solder bump pads 22 and 24 are formed upon one surface of substrate 20 for receiving solder balls that are used to electrically interconnect substrate 20 with a printed circuit board or some other supporting substrate. These solder bump pads are metallic, electrically conductive, and can be formed in the manner, for example, that is described in the above-mentioned U.S. Pat. No. 5,547,740 to Higdon, et al. Solder bump pads are preferably redistributed to the central region of substrate 20 to avoid concentration of the solder bump pads at the peripheral edges of the substrate.

Figure 2:
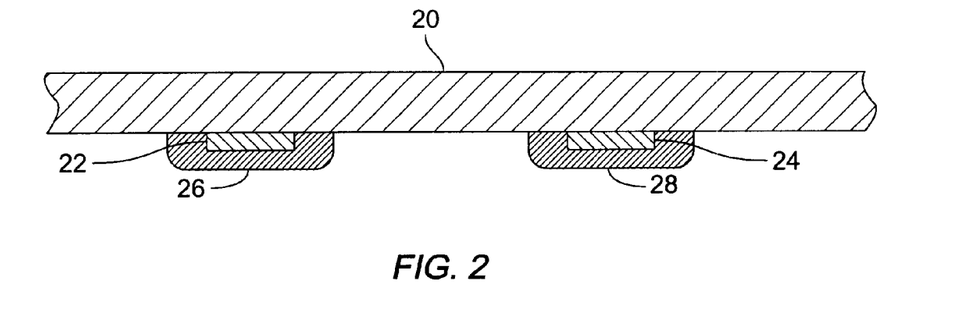
FIG. 2 is a cross-sectional drawing similar to that of FIG. 1 but showing the addition of uncured polymer material applied in a patterned manner over the solder bump pads prior to solder ball placement.

The next step in the method of the present invention is illustrated in FIG. 2 and involves the formation of a patterned layer of uncured polymer material over substrate 20 to cover solder bump pads 22 and 24. In FIG. 2, the patterned regions of uncured polymer material include region 26 covering solder bump pad 22, and region 28 covering solder bump pad 24. This uncured polymer material is preferably of the same type of material known as "no-flow" underfill used more recently in conjunction with flip chip integrated circuits. Typical flip chip underfills are dispensed from the edge of the chip after solder bumps have been formed, after the flip chip has been scribed from the wafer, and after the solder bumps are "reflowed" to a supporting substrate, such as a printed circuit board. In the present invention, however, the no-flow underfill material is applied prior to solder ball attachment, i.e., before solder bumps are formed, and preferably, before individual die are scribed from a semiconductor wafer.

The preferred technique for patterning the polymer material is by printing such material onto the surface of the substrate through a screen or stencil. The screen or stencil has holes formed therein patterned in the same manner as the pattern of solder bump pads, e.g., 22 and 24, formed upon the substrate. The holes in the screen or stencil are slightly oversized compared with the dimensions of the solder bump pads for ensuring that the uncured polymer material overlaps the solder bump pad. The height of the uncured polymer material is preferably less than the height of the solder balls that will ultimately be attached to solder bump pads 22 and 24. While the preferred embodiment patterns the uncured polymer material prior to solder ball attachment, it is also possible to practice the method.of the present invention by applying a continuous, unpatterned layer of uncured polymer material across the surface of the substrate.

Apart from printing the polymer material onto the substrate, other methods of applying the polymer material may also be used. For example, such material could be dispensed onto each solder bump pad by standard dispensing technologies or by so-called "jetting" technologies. In addition, the polymer material can be applied onto the solder bump pads prior to solder ball placement by the so-called "pin transfer" method.

Yet another method of applying the polymer material to the solder bump pads is derived from methods used recently for applying conventional flip chip fluxes to flip chip solder bumps. For this method, each solder ball is grasped, and the base of the grasped solder ball is dipped into a reservoir of the polymer material of controlled depth to coat the base of the solder ball with the polymer material. The grasped solder ball is then placed on its mating solder bump pad thereby simultaneously applying the polymer material to the solder bump pad and placing the solder ball on the solder bump pad. This technique is similar to the aforementioned "pin transfer" method, except that the solder balls themselves serve as the "pins".

The class of no-flow underfll polymer materials used in practicing the preferred embodiment of the present invention is available from a number of materials suppliers including Emerson & Cuming, Kester, Alpha Metals, Loctite, Dexter, etc. In perfecting the present invention, No-Flow-Fluxing Type E-1330 material commercially available from Emerson & Cuming of Billerica, Massachusetts, was used for forming the polymer collar. This material has a storage modulus of 2 Gpa, a CTE (Coefficient of Thermal Expansion) of 90 ppm/° C. and a viscosity of 120,000 centipoise. The material for optimal thermal cycle performance should have a storage modulus between 1.5 and 12 Gpa and a CTE from 20 to 95 ppm/° C. As explained above, the uncured polymer material is preferably printed onto the substrate using a stencil or screen. For optimal printing, the viscosity of the no-flow underfill material must be relatively high to prevent such material from spreading out from the pad significantly; a minimum viscosity of approximately 30,000 centipoise meets this requirement.

Figure 3:
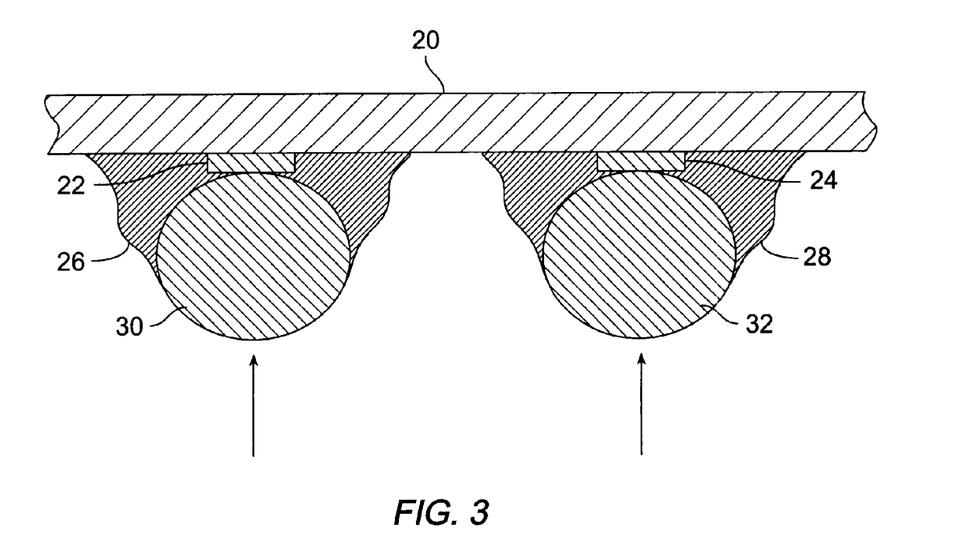
FIG. 3 is a cross-sectional drawing similar to that of FIG. 2 but showing the placement of solder balls into the uncured polymer material and onto the solder bump pads.

Referring to FIG. 3, the next step of the present method in accordance with the preferred embodiment thereof involves the placement of pre-formed solder balls 30 and 32 through the no-flow underfill (uncured polymer) material regions 26 and 28 proximate solder bump pads 22 and 24, respectively. Since the no-flow underfill regions 26 and 28 are not as thick as the diameter of solder balls 30 and 32, only the base portions of solder balls 30 and 32 actually pass into the no-flow underfill regions. The upwardly directed arrows shown in FIG. 3 indicate that the preformed solder balls 30 and 32 are advanced onto solder bump pads 22 and 24. The no-flow underfill material (regions 26 and 28) acts as a solder flux and reduces metal oxides that may have formed upon solder bump pads 22 and 24, and upon the base regions of solder balls 30 and 32.

Figure 4:
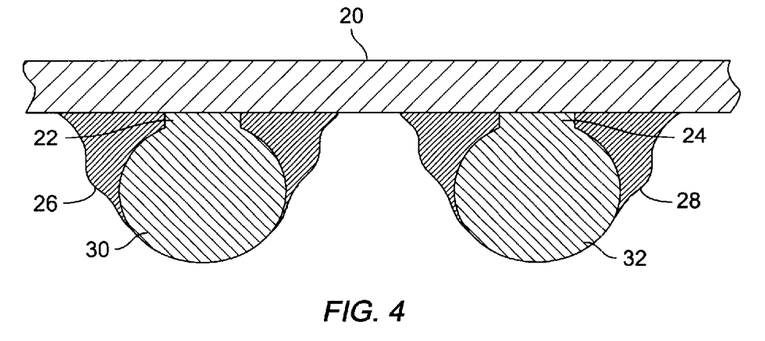
FIG. 4 is a cross-sectional drawing similar to that of FIG. 3 but showing the solder balls attached to the solder bump pads following heating to the characteristic reflow temperature.

In FIG. 4, substrate 20 and solder balls 30 and 32 are heated to the characteristic reflow temperature of such solder balls, thereby joining the base regions of solder balls 30 and 32 to solder bump pads 22 and 24, respectively. Assuming that such solder balls are made from standard 63 Sn/Pb type solder, then the reflow cycle of the solder balls uses a standard 63 Sn/Pb reflow profile. This heating cycle also serves to at least partially cure the polymer material surrounding the base region of the first solder ball. Assuming that substrate 20 is actually a semiconductor wafer, then it will be appreciated that the entire wafer is reflowed to attach the placed solder balls over the entire surface of the wafer. During the reflow process the no-flow material in regions 26 and 28 reduces the oxides by a fluxing action and then, near the end of the reflow cycle, such no-flow underfill material begins to cure in place. In some instances, the initial cure may need to be followed up with a secondary cure heating cycle to complete the process. As shown in FIG. 4, the resulting structure provides solder balls 30 and 32 that are wetted to the associated solder pads 22 and 24, respectively, but wherein polymer support rings 26 and 28 surround and support the base regions of solder balls 30 and 32. It is not believed that any cleaning cycle is required following reflow, as there is no flux residue to be removed.

Figure 5:
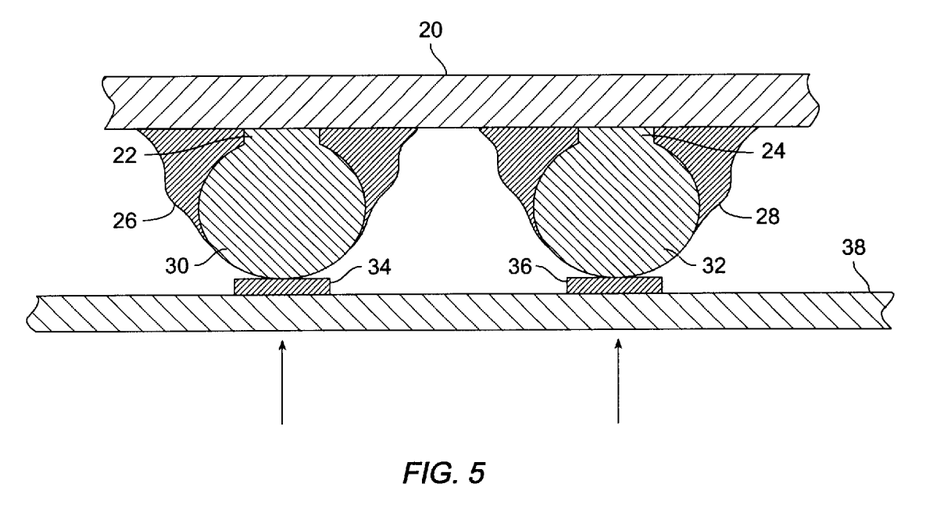
FIG. 5 is a cross-sectional drawing similar to that of FIG. 4 but showing the solder balls being engaged with corresponding solder pads formed upon a second substrate to which the first substrate is to be connected.
Figure 6:
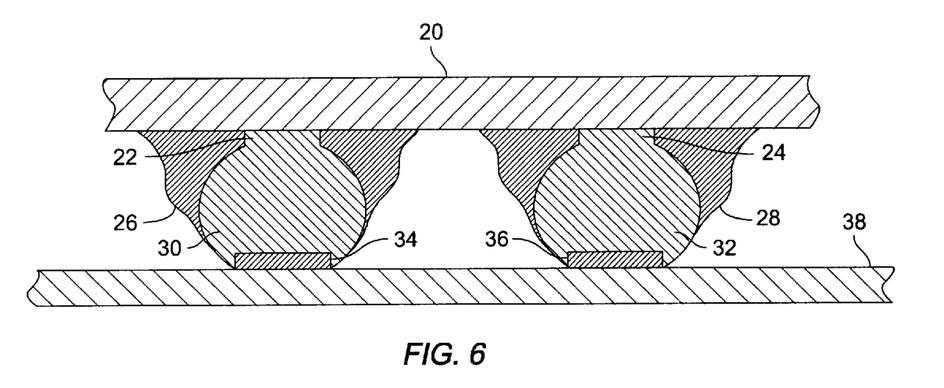
FIG. 6 is a cross-sectional drawing similar to that of FIG. 5 following heating of the assembly to the reflow temperature of the solder balls for attachment of such solder balls to the solder pads formed upon the second substrate.

FIG. 5 shows the IC package of FIG. 4 being placed over a support substrate 38, such as a printed circuit board. A flux is applied over printed circuit board solder pads 34 and 36. Solder balls 30 and 32 are then aligned with, and pressed against (as indicated by the upward arrows in FIG. 5), printed circuit board solder bonding pads 34 and 36, and the entire assembly is again heated to the reflow temperature of solder balls 30 and 32. As shown in FIG. 6, the resulting flip chip structure has solder balls 30 and 32 joined with the solder pads 34 and 36 of printed circuit board substrate 38.

If desired, the above-described method of patterning uncured polymer material over the IC package's solder bump pads can also be used during attachment of an IC package to a printed circuit board. In this IC package application, one dispenses the no-flow underfill material onto the printed circuit board over each solder bond pad, preferably by printing such material onto the printed circuit board through a patterned stencil or screen. As described above, the no-flow underfill material additionally acts as a solder flux. The IC package is then aligned with, and placed over the printed circuit board, in a manner similar to that shown in FIG. 5, except that the solder bumps extend partially into the uncured no-flow underfill material that overlies the solder bond pads on the printed circuit board. In this application, the "base region" of the solder ball corresponds to the portion of the solder ball that is to be joined with solder bond pad on the printed circuit board, rather than the portion of the solder ball that is already jointed to the IC package. Likewise, in this application, the solder bond pads of the printed circuit board are analogous to the above-described solder bond pads formed on the surface of the IC package. The assembly is then raised to the reflow temperature of the solder bumps, the "base region" of the solder balls are joined with the solder bond pads formed on the printed circuit board, and the IC package is thereby joined to the printed circuit board, while at least partially curing the no-flow underfill material that surrounds each of the newly formed joints. If such reflow cycle is insufficient to fully-cure the no-flow underfill material, a secondary heating cycle is performed to fully-cure such material. The cured no-flow underfill material forms a constraining collar around the base of each such solder joint that adheres to the printed circuit board and to the associated solder joint. By forming this constraining collar, the fatigue life of the solder joints is improved by reducing the strain in the entire solder joint, both where the solder ball is joined to the IC package, and where the solder ball is attached to the printed circuit board.

In the preceding paragraph, the process of joining the IC package to the printed circuit board assumed that the no-flow underfill material was dispensed directly upon the solder bond pads of the printed circuit board. In an alternate method, the polymer material is first applied to the regions of the solder balls that are destined to be joined with the printed circuit board, as by dipping the solder balls of the IC package into a reservoir of the polymer material of controlled depth to coat the base regions of the solder ball with the polymer material. The dipped/coated solder balls are then placed on their mating solder bond pads, thereby simultaneously applying the polymer material to the solder bond pads and placing the solder balls on their respective solder bond pads. Again, this technique is similar to the aforementioned "pin transfer" method, except that the solder balls that extend from the IC package themselves serve as the "pins".

Figure 7:
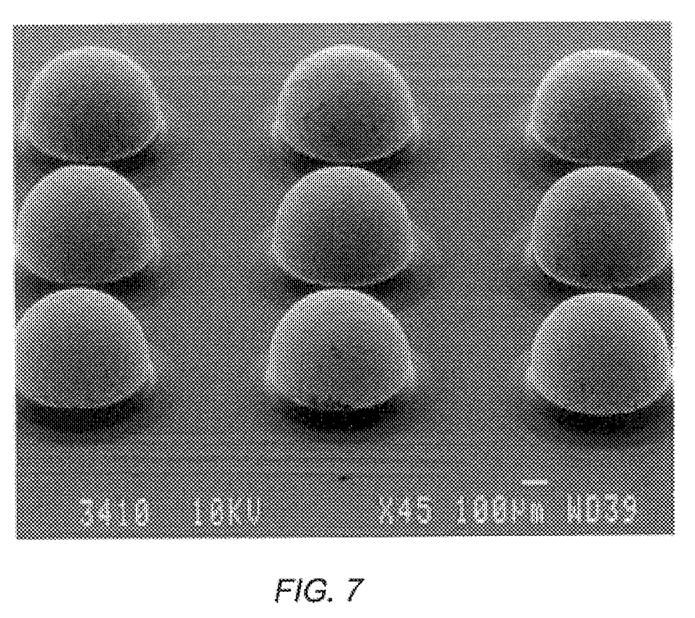
FIG. 7 is a microphotograph of a substrate upon which a series of nine such solder bumps have been formed, each incorporating a supporting polymer collar formed in accordance with the present invention.
Figure 8:
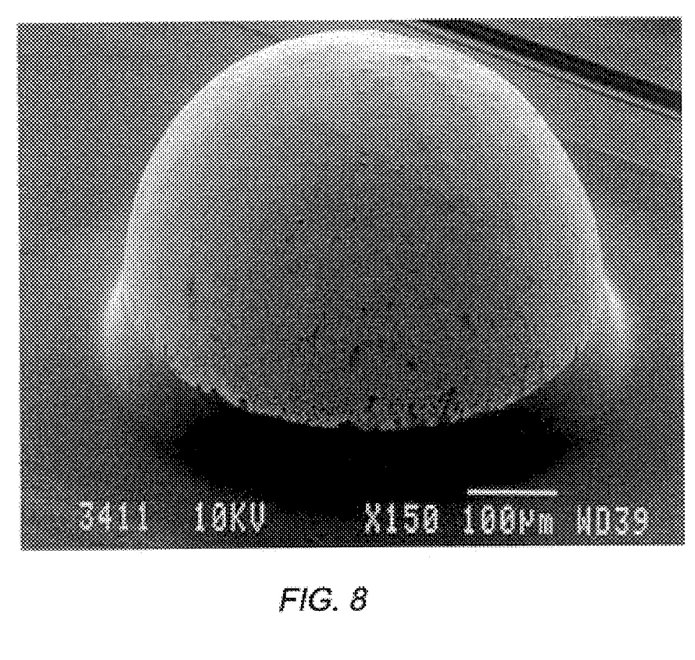
FIG. 8 is an enlarged microphotograph of one such solder bump incorporating the polymer collar of the present invention.

FIG. 7 is a microphotograph magnified at 45 times magnification and showing a series of nine such solder bumps, each supported by a polymer collar, in accordance with the method described above. FIG. 8 is a microphotograph magnified at 150 times magnification, and depicting one such solder bump including the cured polymer collar surrounding its base. It is evident from FIGS. 7 and 8 that good soldering of the ball to the underlying solder pad has occurred, and that the solder is well formed and spherical. In FIG. 8, the polymer collar is shown to be well formed, and one may see that the polymer collar provides additional mechanical support to the base of the solder ball; it is in this area of the solder ball where typical solder fatigue failures occur. The polymer collar construction not only helps to support the solder ball surrounded thereby relative to withstanding shear stress, thereby improving its reliability, but also assures that the solder ball maintains the desired shape during and after reflow operations (such as during board attachment), and during thermal cycling. The maintenance of the shape of the solder ball is believed to be significant in improving the reliability of the resulting solder joint.

Figure 9:
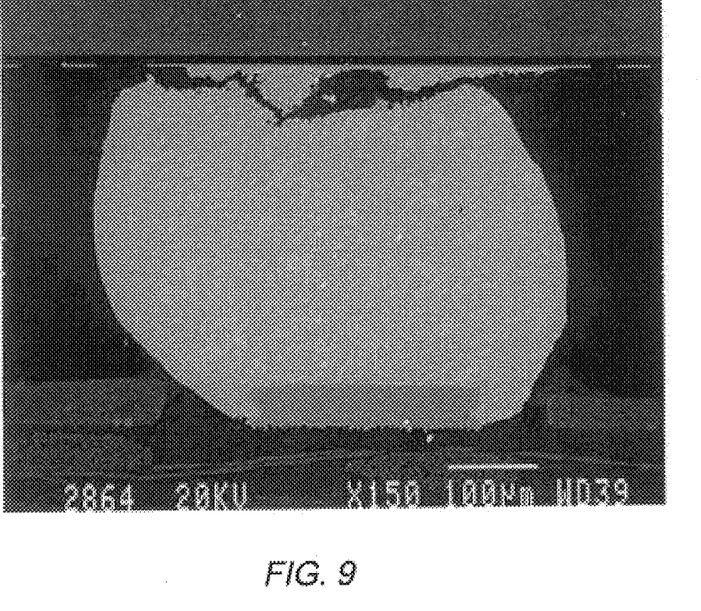
FIG. 9 is an enlarged cross-sectional view of a typical solder joint, without the polymer collar described above, after being subjected to 1,000 temperature stress cycles; the IC package appears in the upper portion of the figure, and the printed circuit board to which it is joined appears in the lower portion of the figure. A large fatigue crack is visible in the upper portion of the figure adjacent the IC package, while little sign of solder fatigue appears adjacent the printed circuit board.

FIG. 9 is a microphotograph magnified at 150 times magnification and showing a cross-section of a solder joint that has been temperature-cycled 1,000 times between the extremes of −40° C. and +125° C. The solder joint shown in FIG. 9 does not include the polymer collar formed in accordance with the present invention. In FIG. 9, the printed circuit board is shown along the bottom of the photograph, and the IC package is shown along the top of the photograph. As can be seen, a significant fatigue crack has developed at the interface between the base of the solder ball and the solder bump pad of the IC package.

Figure 10:
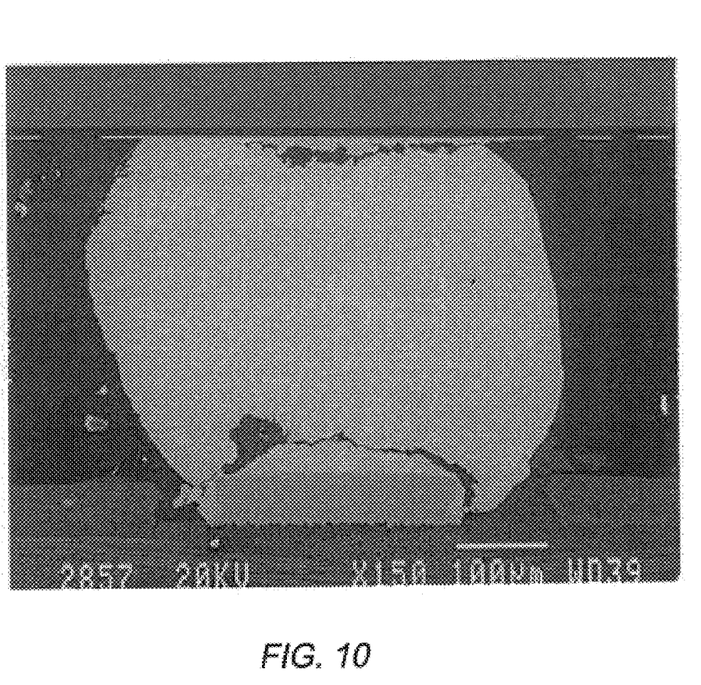
FIG. 10 is a cross-sectional view of a solder joint that includes a supporting polymer collar formed in accordance with the present invention, also after being subjected to 1,000 temperature stress cycles; the IC package again appears in the upper portion of the figure, and the printed circuit board to which it is joined appears in the lower portion of the figure. A much smaller fatigue crack is visible in the upper portion of the figure, while a fatigue crack now appears proximate the printed circuit board.

FIG. 10 is a microphotograph also magnified at 150 times magnification and showing a cross-section of a solder joint that has been temperature-cycled 1,000 times between the extremes of −40° C. and +125° C. The solder joint shown in FIG. 10 includes the polymer collar formed in accordance with the present invention at the base of the solder ball where it attaches to the IC package solder bump pad. In FIG. 10, the printed circuit board is again shown along the bottom of the photograph, and the IC package is again shown along the top of the photograph. As can be seen, fatigue cracking at the base of the solder ball adjacent the IC package solder bump pad is significantly reduced as compared with the joint shown in FIG. 9. Indeed, a fatigue crack has instead developed at the interface between the solder joint and the solder pad of the printed circuit board, indicating that fatigue stress is being transferred to the opposite end of the solder joint. This transference of failure mode from near the IC package to near the printed circuit board provides evidence of the efficacy of the polymer collar re-enforcement.

Those skilled in the art will now appreciate that a simple and relatively inexpensive method has been described for forming a solder-bumped structure which improves the solder joint fatigue life and results in a reduction in manufacturing costs compared to other techniques currently used to stabilize solder bump joints. The described method is performed during the IC package fabrication process, rather than during the IC package assembly process to the board; this greatly simplifies an IC package process that utilizes traditional underfill technology. The described method is consistent with standard IC package manufacturing processes. The described method can be applied to a variety of IC packaging applications, including Ball Grid Array (BGA), Chip Scale Package (CSP), wafer level packages (WLPs), and flip chip structures, and the sequence of operations used in practicing the above-described process is simpler than that required for competing polymer reinforcement processes. The no-flow underfill material used to form the polymer collar serves to simultaneously flux the solder joint region prior to reflow, as well as to mechanically support and stabilize the base of the solder ball. The described polymer collars help to maintain the original shape of solder balls during ball attachment and during subsequent reflow operations. The polymer collar protects the solder ball from fatigue induced by thermal coefficient expansion differentials, thereby increasing the reliability of such solder ball.

While the present invention has been described with respect to a preferred embodiment thereof, such description is for illustrative purposes only, and is not to be construed as limiting the scope of the invention. For example, while the no-flow underfill material described above is sometimes referred to as uncured polymer material, an alternative embodiment could make use of a partially polymerized sheet, possibly being patterned to match the solder bump pads over which it is applied. The solder balls could then be placed onto, and partially through, such partially polymerized sheet proximate the solder bump pads prior to reflow. Thus, the term "uncured polymer material" as used herein should be construed as including a partially polymerized sheet or layer of no-flow underfill material that is no fully-cured. Various modifications and changes may be made to the described embodiment by those skilled in the art without departing from the true spirit and scope of the invention as defined by the appended claims.

We claim:

1. A method of forming a solder-bumped structure, said method comprising the steps of:
   a. providing a first conductive solder bump pad on a surface of a substrate;
   b. applying uncured polymer material over the first conductive solder bump pad, the uncured polymer material having an initial thickness proximate the first conductive solder bump pad;
   c. following step b., placing a base region of a first pre-formed solder ball into the uncured polymer material and onto the first conductive solder bump pad, the first pre-formed solder ball having a height that is greater than the initial thickness of the uncured polymer material proximate the first conductive solder bump, the first solder ball having a characteristic reflow temperature; and
   d. heating the substrate to the reflow temperature of the first solder ball to join the base region of the first solder ball to the first conductive solder bump pad and to at least partially cure the polymer material surrounding the base region of the first solder ball, the first solder ball protruding above the at least partially cured polymer material surrounding the base region of the first solder ball.

2. The method recited by claim 1 wherein step a. includes the step of providing a second conductive solder bump pad on the surface of the substrate, wherein step b. includes the step of applying the uncured polymer material over the second conductive solder bump pad, wherein step c. includes the step of placing a base region of a second pre-formed solder ball into the uncured polymer material and onto the second conductive solder bump pad, and wherein step d. includes the step of joining the base region of the second solder ball to the second conductive solder bump pad and at least partially curing the polymer material surrounding the base region of the second solder ball.

3. The method recited by claim 2 wherein the steps of applying uncured polymer material over the first and second conductive solder bump pads includes the step of forming patterned regions of uncured polymer material, said patterned regions including a first region overlying the first conductive solder bump pad, and a second region overlying the second conductive solder bump pad.

4. The method recited by claim 3 wherein the step of forming patterned regions of uncured polymer material includes the step of applying the uncured polymer material through a screen onto the substrate.

5. The method recited by claim 3 wherein the step of forming patterned regions of uncured polymer material includes the step of applying the uncured polymer material through a stencil onto the substrate.

6. The method recited by claim 3 wherein the step of forming patterned regions of uncured polymer material includes the step of dispensing the uncured polymer material over each solder bump pad from a dispenser.

7. The method recited by claim 3 wherein the step of forming patterned regions of uncured polymer material includes the step of dispensing the uncured polymer material over each solder bump pad by jetting such material onto each such solder bump pad.

8. The method recited by claim 3 wherein the step of forming patterned regions of uncured polymer material includes the step of transferring the uncured polymer material over each solder bump pad using a pin transfer technique.

9. The method recited by claim 3 wherein the uncured polymer material is a no-flow underfill material.

10. The method recited by claim 9 wherein the no-flow underfill material is of a type which achieves a fluxing action by reducing metal oxides that may have formed upon the first conductive solder bump pad, and by reducing metal oxides that may have formed upon the base region of the first solder ball.

11. The method recited by claim 9 wherein the no-flow underfill material has a viscosity of at least 30,000 centipoise.

12. The method recited by claim 1 wherein the uncured polymer material is of a type which achieves a fluxing action by reducing metal oxides that may have formed upon the first conductive solder bump pad, and by reducing metal oxides that may have formed upon the base region of the first solder ball.

13. The method recited by claim 1 wherein the uncured polymer material is a no-flow underfill material.

14. The method recited by claim 13 wherein the no-flow underfill material is of a type which achieves a fluxing action by reducing metal oxides that may have formed upon the first conductive solder bump pad, and by reducing metal oxides that may have formed upon the base region of the first solder ball.

15. The method recited by claim 13 wherein the no-flow underfill material has a viscosity of at least 30,000 centipoise.

16. The method recited by claim 1 further including the step of further heating the polymer material following step d. to further cure the polymer material.

17. A method of forming a solder-bumped structure, said method comprising the steps of:
   a. providing a conductive solder bump pad on a surface of a substrate;
   b. providing a pre-formed solder ball, the solder ball having a characteristic reflow temperature, the preformed solder ball having a base region and an upper region atop the base region;
   c. applying uncured polymer material over at least the base region of the solder ball, but leaving at least a portion of the upper region free from uncured polymer material;

d. following step c, placing the base region of the solder ball onto the conductive solder bump pad, thereby applying uncured polymer material to the surface of the substrate over the solder bump pad; and e. heating the substrate to the reflow temperature of the solder ball to join the base region of the solder ball to the solder bump pad and to at least partially cure the polymer material surrounding the base region of the solder ball while leaving at least a portion of the upper region free of polymer material.

18. The method recited by claim 17 wherein the step of providing a pre-formed solder ball includes the step of grasping a pre-formed solder ball before said solder ball is attached to any substrate.

19. The method recited by claim 17 wherein the step of providing a pre-formed solder ball includes the step of providing said solder ball already attached to an IC package.

20. The method recited by claim 17 wherein the uncured polymer material is a no-flow underfill material.

21. The method recited by claim 20 wherein the no-flow underfill material is of a type which achieves a fluxing action by reducing metal oxides that may have formed upon the first conductive solder bump pad, and by reducing metal oxides that may have formed upon the base region of the solder ball.

22. The method recited by claim 20 wherein the no-flow underfill material has a viscosity of at least 30,000 centipoise.

23. The method recited by claim 17 further including the step of further heating the polymer material following step e. to further cure the polymer material.

24. A method of forming solder bumps on an active surface of an integrated circuit, said method comprising the steps of:

a. providing a first conductive solder bump pad on the active surface of an integrated circuit;

b. applying uncured polymer material over the first conductive solder bump pad;

c. following step b., placing a base region of a first pre-formed solder ball into the uncured polymer material and onto the first conductive solder bump pad, the first solder ball having a characteristic reflow temperature; and d. heating the first solder ball and the integrated circuit to the reflow temperature of the first solder ball to join the base region of the first solder ball to the first conductive solder bump pad and to at least partially cure the polymer material surrounding the base region of the first solder ball, thereby securing the first solder ball to the active surface of the integrated circuit.

25. The method recited by claim 24 wherein step a. includes the step of providing a second conductive solder bump pad on the active surface of the integrated circuit, wherein step b. includes the step of applying the uncured polymer material over the second conductive solder bump pad, wherein step c. includes the step of placing a base region of a second preformed solder ball into the uncured polymer material and onto the second conductive solder bump pad, and wherein step d. includes the step of joining the base region of the second solder ball to the second conductive solder bump pad and at least partially curing the polymer material surrounding the base region of the second solder ball, thereby securing the second solder ball to the active surface of the integrated circuit.

26. The method recited by claim 25 wherein the steps of applying uncured polymer material over the first and second conductive solder bump pads includes the step of forming patterned regions of uncured polymer material, said patterned regions including a first region overlying the first conductive solder bump pad, and a second region overlying the second conductive solder bump pad.

27. The method recited by claim 24 further including the step of further heating the polymer material following step d. to further cure the polymer material.

28. A method of forming solder bumps on an active surface of an integrated circuit, said method comprising the steps of:

a. providing a conductive solder bump pad on the active surface of the integrated circuit;

b. providing a pre-formed solder ball, the solder ball having a characteristic reflow temperature;

c. applying uncured polymer material over a base region of the solder ball;

d. placing the base region of the solder ball onto the conductive solder bump pad, thereby applying uncured polymer material to the active surface of the integrated circuit over the solder bump pad; and e. heating the solder ball and integrated circuit to the reflow temperature of the solder ball to join the base region of the solder ball to the solder bump pad and to at least partially cure the polymer material surrounding the base region of the solder ball, thereby securing the solder ball to the active surface of the integrated circuit.

29. The method recited by claim 28 further including the step of further heating the polymer material following step e. to further cure the polymer material.

30. A method of forming a solder-bumped structure, said method comprising the steps of:

a. providing first and second conductive solder bump pads on a surface of a substrate;

b. applying a first portion of uncured polymer material over the first conductive solder bump pad, and applying a second portion of uncured polymer material over the second conductive solder bump pad, the first and second portions of uncured polymer material being spaced apart from each other;

c. following step b., placing a base region of a first pre-formed solder ball into the first portion of uncured polymer material and onto the first conductive solder bump pad, and placing a base region of a second pre-formed solder ball into the second portion of uncured polymer material and onto the second conductive solder bump pad, the first and second solder balls having a characteristic reflow temperature; and d. heating the substrate to the reflow temperature of the first and second solder balls to join the base region of the first solder ball to the first conductive solder bump pad, to join the base region of the second solder ball to the second conductive solder bump pad, and to at least partially cure the polymer material surrounding the base regions of the first and second solder balls.

31. The method recited by claim 30 wherein the first and second portions of uncured polymer material are a no-flow underfill material.

32. The method recited by claim 31 wherein the no-flow underfill material is of a type which achieves a fluxing action by reducing metal oxides that may have formed upon the first and second conductive solder bump pads, and by reducing metal oxides that may have formed upon the base regions of the first and second solder balls.

33. The method recited by claim 30 further including the step of further heating the polymer material following step d. to further cure the polymer material.

34. A method of forming a solder-bumped structure, said method comprising the steps of:
   a. providing first and second conductive solder bump pads on a surface of a substrate;
   b. providing first and second pre-formed solder balls, the solder balls having a characteristic reflow temperature;
   c. applying uncured polymer material over base regions of the first and second solder balls;
   d. placing the base regions of the first and second solder balls onto the first and second conductive solder bump pads, respectively, thereby applying a first portion of uncured polymer material to the surface of the substrate over the first solder bump pad, and thereby applying a second portion of uncured polymer material to the surface of the substrate over the second solder bump pad; and
   e. heating the substrate to the reflow temperature of the solder balls to join the base regions of the first and second solder balls to the first and second solder bump pads, respectively, and to at least partially cure the polymer material surrounding the base regions of the first and second solder balls.

35. The method recited by claim 34 wherein the uncured polymer material is a no-flow underfill material.

36. The method recited by claim 35 wherein the no-flow underfill material is of a type which achieves a fluxing action by reducing metal oxides that may have formed upon the first conductive solder bump pad, and by reducing metal oxides that may have formed upon the base region of the solder ball.

37. The method recited by claim 34 further including the step of further heating the polymer material following step e. to further cure the polymer material.

* * * * *